US011582881B2

(12) United States Patent
Li et al.

(10) Patent No.: US 11,582,881 B2
(45) Date of Patent: Feb. 14, 2023

(54) CABINET AND SERVER HAVING THE CABINET

(71) Applicant: Fulian Precision Electronics (Tianjin) Co., LTD., Tianjin (CN)

(72) Inventors: Han-Yu Li, New Taipei (TW); Gong-Wen Zhang, Tianjin (CN); Yang Li, Tianjin (CN); Jin-Xing Zhang, Tianjin (CN); San-Long Zhou, Tianjin (CN); Jun Li, Shenzhen (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/538,070

(22) Filed: Nov. 30, 2021

(65) Prior Publication Data

US 2023/0007804 A1 Jan. 5, 2023

(30) Foreign Application Priority Data

Jul. 2, 2021 (CN) .......................... 202110751375.1

(51) Int. Cl.
*H05K 7/14* (2006.01)
*H05K 7/18* (2006.01)

(52) U.S. Cl.
CPC ........... *H05K 7/1489* (2013.01); *H05K 7/183* (2013.01)

(58) Field of Classification Search
CPC .... G06F 1/187; H05K 5/0221; H05K 7/1489; H05K 7/183
See application file for complete search history.

(56) References Cited

U.S. PATENT DOCUMENTS

| 7,710,715 | B2* | 5/2010 | Furey ...................... | G06F 1/181 |
| | | | | 361/752 |
| 7,944,700 | B2* | 5/2011 | Wang ...................... | G06F 1/183 |
| | | | | 361/736 |
| 8,369,092 | B2* | 2/2013 | Atkins ................. | H05K 7/1487 |
| | | | | 361/730 |
| 8,770,681 | B2* | 7/2014 | Hu ....................... | A47B 96/025 |
| | | | | 312/223.2 |
| 8,922,987 | B2* | 12/2014 | Lin ...................... | H05K 7/1492 |
| | | | | 361/679.33 |
| 9,532,480 | B2* | 12/2016 | Shen ...................... | G06F 1/184 |
| 9,535,468 | B2* | 1/2017 | Yu ........................ | G06F 1/1626 |
| 9,717,160 | B2* | 7/2017 | Hayashi ............... | H05K 7/1492 |
| 9,763,350 | B2* | 9/2017 | Rust ..................... | G11B 33/126 |
| 9,851,764 | B2* | 12/2017 | Harvilchuck ........... | G06F 1/187 |
| 9,930,804 | B2* | 3/2018 | Lu ........................ | H05K 7/1489 |

(Continued)

*Primary Examiner* — Patrick D Hawn
(74) *Attorney, Agent, or Firm* — ScienBiziP, P.C.

(57) ABSTRACT

A cabinet and a server having the cabinet are disclosed, the cabinet includes a housing, two trays, an elastic piece, and a limiting piece. The trays are arranged in parallel and capable of sliding out of an opening or retracting in the housing. The elastic piece is connected to the housing and arranged between the trays. The limiting piece is connected to the elastic piece and arranged between the trays, each of the trays defines a hole corresponding to the limiting piece, each of the trays includes a protrusion. When one of the trays slides out of the opening, the protrusion slides to the limiting piece and pushes the limiting piece into the hole of the other tray; when the tray retracts in the housing, the protrusion slides away from the limiting piece, the elastic piece elastically recover the limiting piece to separate from the hole.

16 Claims, 7 Drawing Sheets

(56) References Cited

U.S. PATENT DOCUMENTS

| | | | |
|---|---|---|---|
| 9,967,997 B1* | 5/2018 | Shen | H05K 7/1489 |
| 10,091,905 B1* | 10/2018 | Konovalov | H05K 7/1489 |
| 10,537,040 B1* | 1/2020 | Yeh | G06F 1/181 |
| 10,548,245 B2* | 1/2020 | Lipp | H05K 7/1489 |
| 10,736,229 B2* | 8/2020 | Konovalov | G11B 33/142 |
| 10,827,641 B1* | 11/2020 | Shen | H05K 7/20709 |
| 11,078,667 B2* | 8/2021 | Kelly | E04C 3/07 |
| 11,439,045 B2* | 9/2022 | Korolenko | H05K 7/20727 |
| 2013/0112633 A1* | 5/2013 | Chen | G06F 1/187 |
| | | | 211/26 |
| 2013/0200026 A1* | 8/2013 | Bryson | F25D 25/021 |
| | | | 211/126.14 |
| 2014/0016265 A1* | 1/2014 | Saito | G06F 1/183 |
| | | | 361/679.48 |
| 2014/0204525 A1* | 7/2014 | Pecone | H05K 7/02 |
| | | | 361/679.33 |
| 2014/0238945 A1* | 8/2014 | Alvarez | H04Q 1/023 |
| | | | 211/26.2 |
| 2015/0043146 A1* | 2/2015 | Li | H05K 7/1487 |
| | | | 361/679.31 |
| 2016/0132078 A1* | 5/2016 | Shen | G06F 11/2005 |
| | | | 361/679.32 |
| 2016/0165739 A1* | 6/2016 | Li | H05K 7/1489 |
| | | | 361/679.58 |
| 2016/0219748 A1* | 7/2016 | Tsai | H05K 7/1487 |
| 2022/0124933 A1* | 4/2022 | Li | H05K 7/1489 |

\* cited by examiner

CABINET AND SERVER HAVING THE CABINET

CROSS-REFERENCE TO RELATED APPLICATIONS

This application claims priority to Chinese Patent Application No. 202110751375.1 filed on Jul. 2, 2021 in China National Intellectual Property Administration, the contents of which are incorporated by reference herein.

FIELD

The subject matter herein generally relates to server manufacture, and particularly to a cabinet and a server having the cabinet.

BACKGROUND

Interior space of a server is limited, and a cabinet of the server includes two trays on opposite sides. When one of the trays on one side is pulled out, the tray on the other side is locked, to prevent accidents. Traditional cabinets include two trays which need a large interior space for the self-locking structure. Such designs occupy extra space and decrease utility of the interior space, which also affect the overall designs of the servers. Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
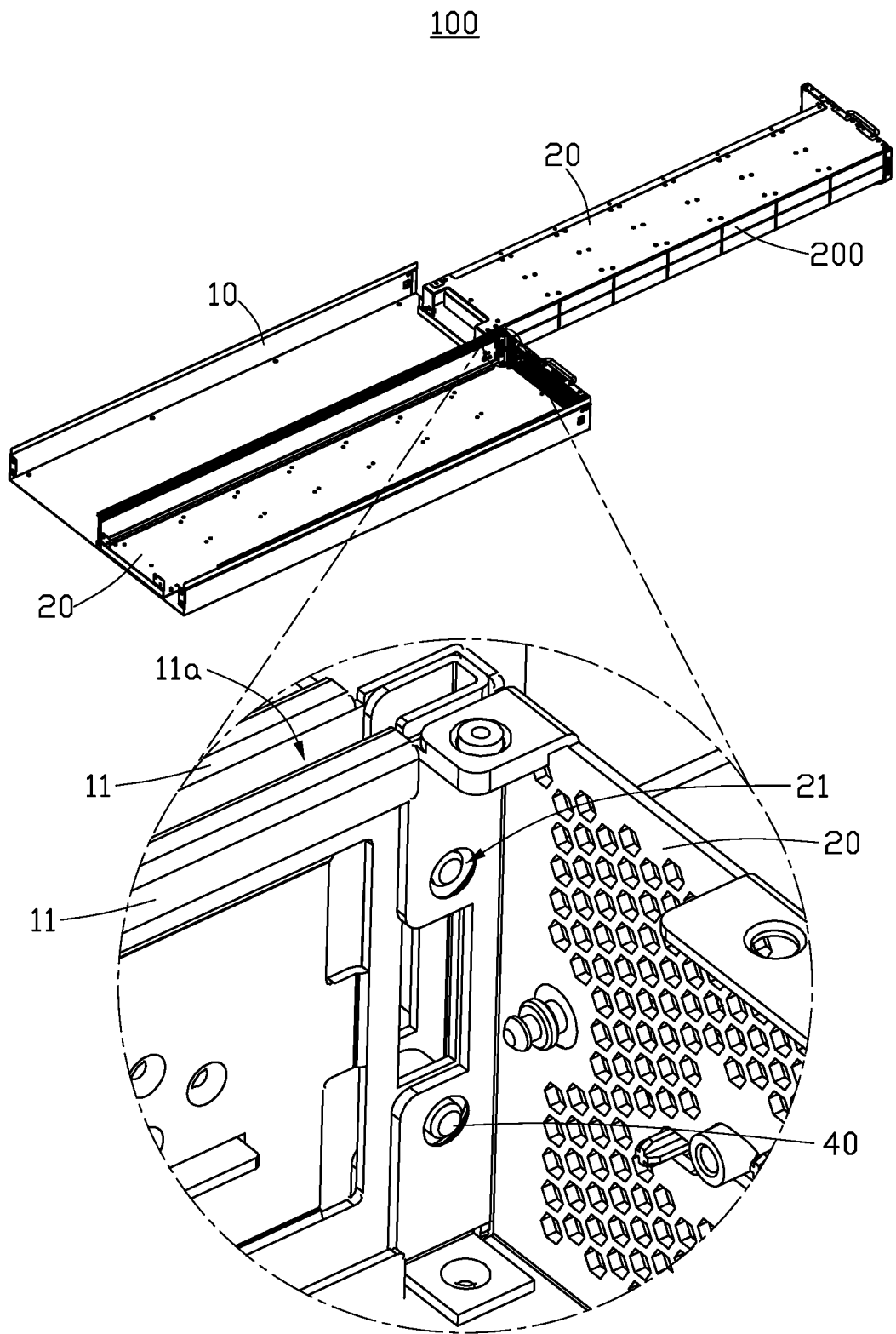
FIG. 1 is a schematic diagram of at least one embodiment of a cabinet for a server according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better show details and features of the present disclosure.

Several definitions that apply throughout this disclosure will now be presented.

The term "coupled" is defined as connected, whether directly or indirectly through intervening components, and is not necessarily limited to physical connections. The connection may be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but may have one or more deviations from a true cylinder. The term "comprising," when utilized, means "including, but not necessarily limited to"; it specifically indicates open-ended inclusion or membership in the so-described combination, group, series, and the like.

The present disclosure is described in relation to a cabinet and a server having the same.

Figure 2:
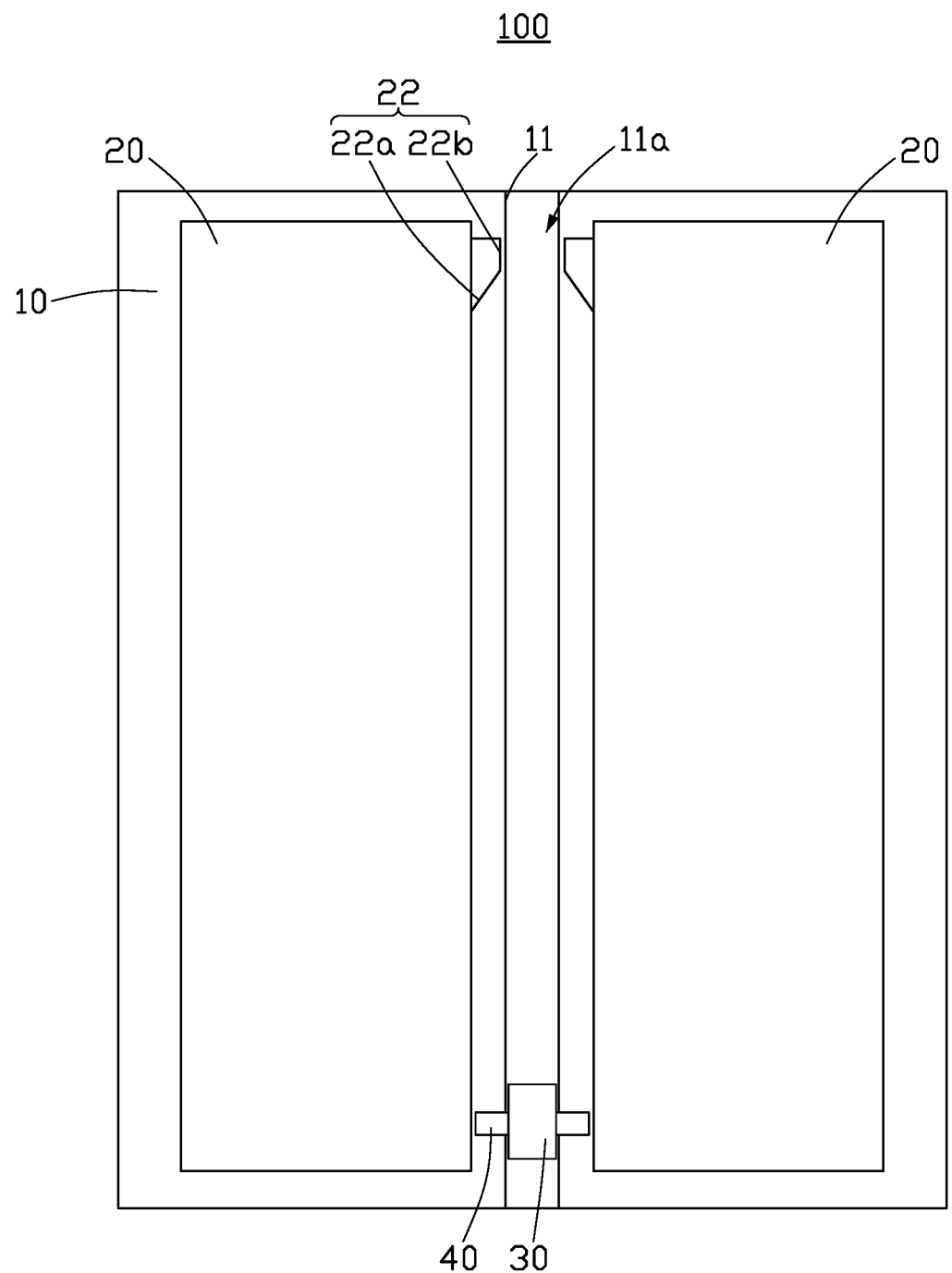
FIG. 2 is another schematic diagram of at least one embodiment of the cabinet according to the present disclosure.
Figure 3:
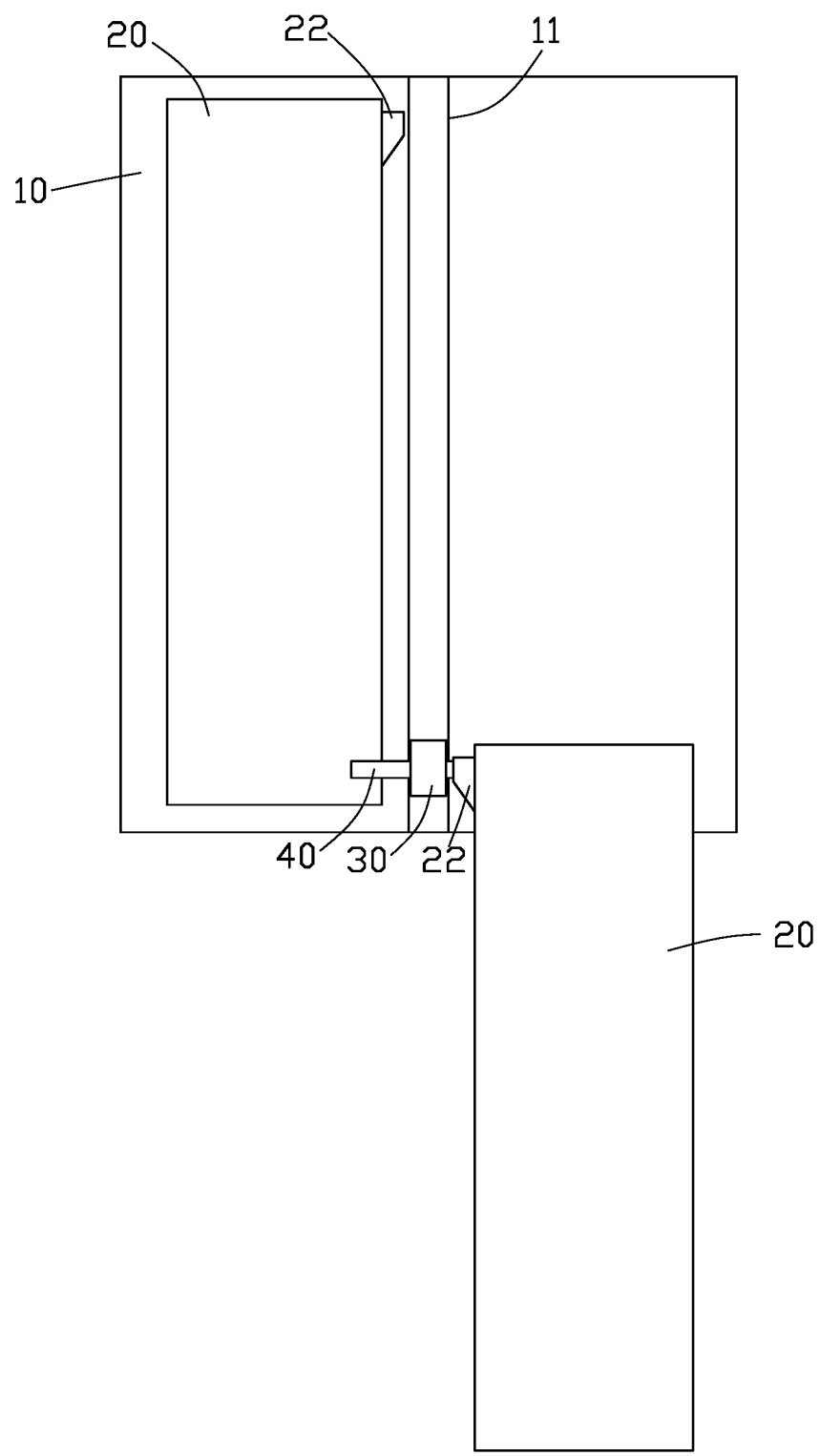
FIG. 3 is a schematic diagram of at least one embodiment of the cabinet of FIG. 2 in another state.

FIGS. 1, 2, and 3 illustrate at least one embodiment of a cabinet 100 for mounting electronic components 200, cabinet 100 has a self-locking function. The cabinet 100 includes a housing 10, at least one tray 20, an elastic piece 30, and a limiting piece 40. The housing 10 is substantially a cuboid box defining a chamber with an opening on a side. The cabinet 100 includes two trays 20 arranged horizontally in parallel. Each of the two trays 20 may independently extend out of the chamber or retract into the chamber. Each of the two trays 20 is configured to hold a plurality of electronic components 200. The elastic piece 30 is fixedly connected to a side of the housing 10 close to the opening and arranged between the two trays 20. The limiting piece 40 is connected to the elastic piece 30 and arranged between the two trays 20. Each of the two trays 20 defines a hole 21 corresponding to the limiting piece 40, each of the two trays 20 includes a protrusion 22 protruding into the interior of the chamber.

In at least one embodiment, the self-locking method of the cabinet 100 is that after one of the trays 20 slides out of the opening to a maximum extent, the protrusion 22 may slide to the limiting piece 40 and pushes the limiting piece 40 into the hole 21 of the other tray 20 (as shown in FIG. 3), so as to limit a movement of the other tray 20. Thereby, the other tray 20 is locked in place. After the tray 20 is retracted back in the housing 10, the protrusion 22 separates from the limiting piece 40, the elastic piece 30 elastically recovers the limiting piece 40, so the limiting piece 40 is separated from the hole 21, unlocking the other tray 20 (as shown in FIG. 2). Thus, when any one of the trays 20 is pulled out of the housing 10, the other tray 20 is locked, so as to prevent top-heavy accidents. In at least one embodiment, the electronic components 200 may be hard disks.

Referring to FIG. 1, in at least one embodiment, the housing 10 includes at least one separator 11, two separators 11 being preferred. The two separators 11 are vertically arranged between the two trays 20 and parallel to the sliding direction of the trays 20. The two separators 11 form a gap 11a therebetween. The gap 11a is configured to receive the elastic piece 30 and the limiting piece 40. Each of the two separators 11 defines a through hole (not shown). Opposite ends of the limiting piece 40 are inserted into the vias, respectively, so the opposite ends of the limiting piece 40 are further inserted into the holes 21. In at least one embodiment, the limiting piece 40 may be a bolt.

Referring to FIGS. 2 and 3, in at least one embodiment, the protrusion 22 includes a bevel 22a and a plane 22b connected to the bevel 22a. The protrusion 22 may be vertically arranged to a side of the tray 20. The bevel 22a faces the limiting piece 40. The plane 22b extends along the sliding direction of the trays 20. When the trays 20 slide out of the opening, the bevel 22a firstly contacts an end of the limiting piece 40, and pushes the limiting piece 40 so that the other end of the limiting piece 40 is inserted into the hole 21, until the tray 20 slides out of the opening to the maximum extent. At this time, the limiting piece 40 resists the plane 22b, the plane 22b is configured to retain the position of the limiting piece 40 and retain the other end of the limiting piece 40 in the hole 21. When the tray 20 is retracted in the opening, the plane 22b and the bevel 22a gradually move away from the limiting piece 40, and the elastic piece 30 pushes the limiting piece 40 to recover. In at least one embodiment, the bevel 22a is configured to provide a portion for the protrusion 22 pushing the limiting piece 40 and preventing any jamming.

Furthermore, in at least one embodiment, a section of the limiting piece 40 may be circular, each of the opposite ends can include a rounded corner or a chamfer decreasing a friction between the limiting piece 40 and the bevel 22a, the plane 22b and preventing jamming.

Figure 4:
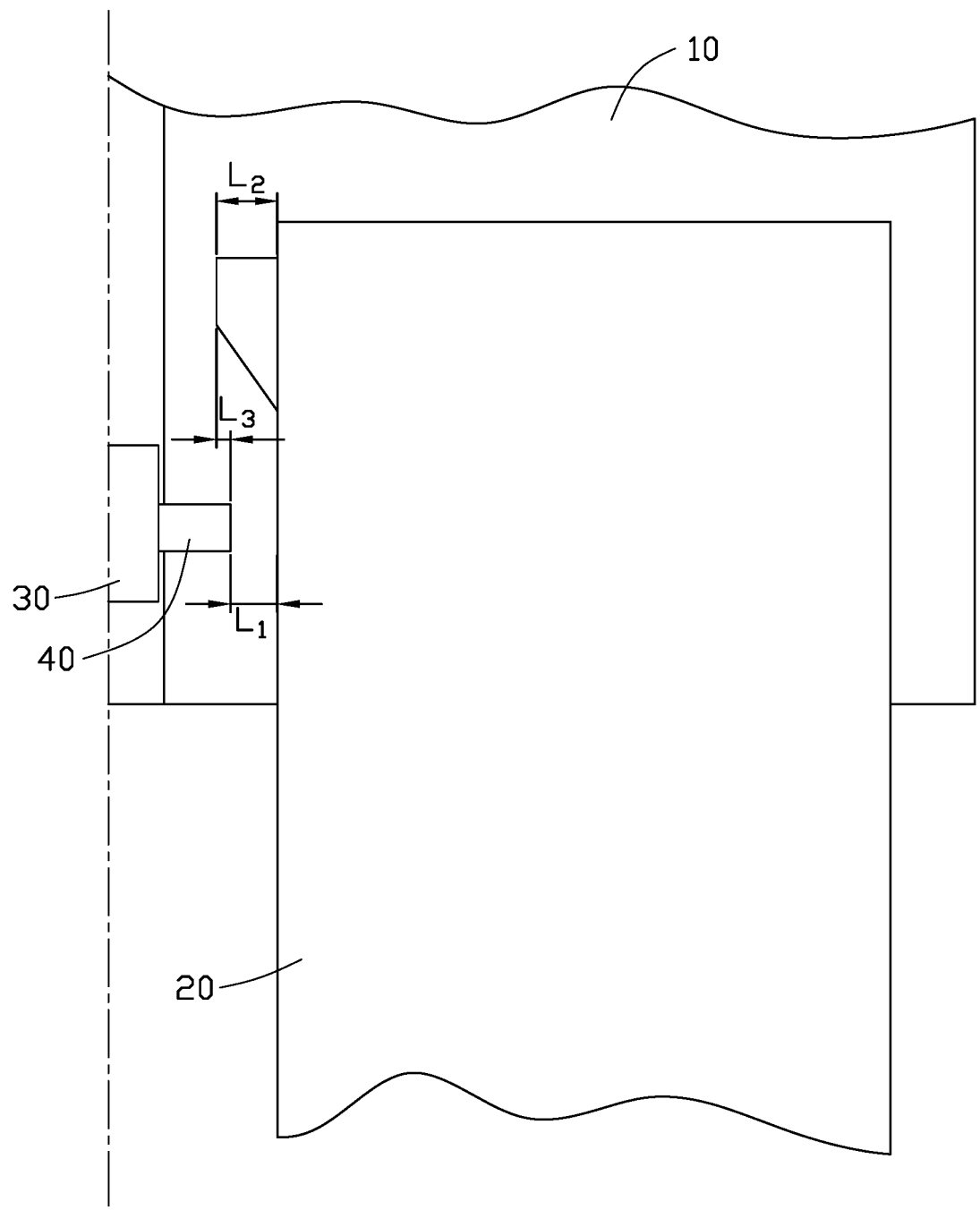
FIG. 4 is a schematic diagram of at least one embodiment of the cabinet of FIG. 2 in another state.

Referring to FIG. 4, in at least one embodiment, when the tray 20 is retracted in the opening, the two trays 20 and the limiting piece 40 are in mirror symmetry relative to a central section of the limiting piece 40. A distance between an end of the limiting piece 40 and the tray 20 is L1, that is L1 is also the distance between the end of the limiting piece 40 and the hole 21. A maximum height of the protrusion 22 is L2. When L1<L2, the protrusion 22 will resist and push the limiting piece 40, otherwise the protrusion 22 may be unable to reach the limiting piece 40.

Furthermore, along an axis direction of the limiting piece 40, a distance between the end of the limiting piece 40 and the maximum height of the protrusion 22 is L3. L3=L2−L1. When L3>L1, the protrusion 22 will resist the limiting piece 40 and be inserted into the hole 21, otherwise the protrusion 22 may not reach the hole 21. Since L3=L2−L1>L1, L2/2>L1, that is L1 is smaller than one half of L2.

Referring to FIG. 1, in at least one embodiment, there are two limiting pieces 40 and two holes 21 arranged symmetrically, meanwhile, there are two protrusions 22 for improving a stability of the trays 20. In other embodiments, the quantity of limiting pieces 40, holes 21, and protrusions 22 may be to correspond with other numbers.

Figure 5:
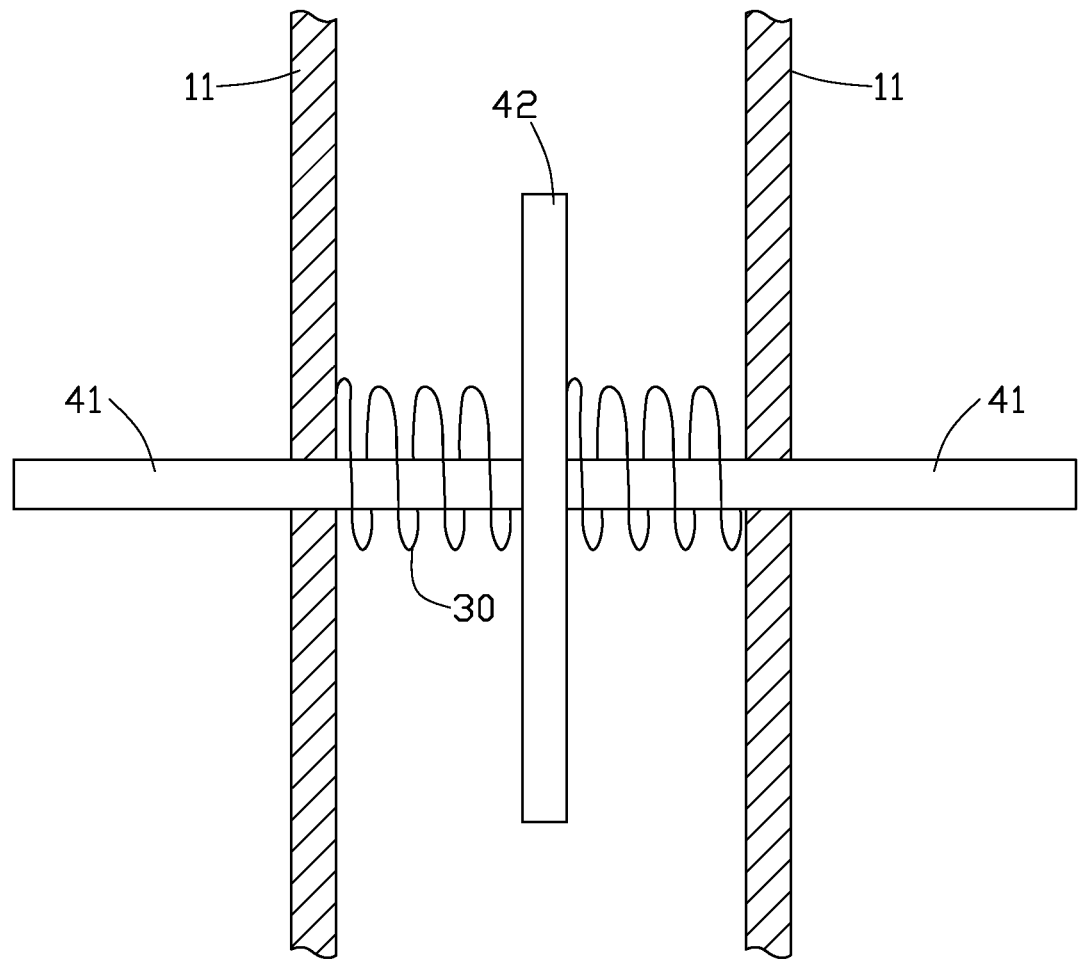
FIG. 5 is a schematic diagram of at least one embodiment of a limiting piece and an elastic piece of the cabinet according to the present disclosure.

Referring to FIG. 5, in at least one embodiment, the limiting piece 40 includes a column 41 and a plate 42. The plate 42 is connected to a middle of the column 41 and arranged between the two separators 11. The two elastic pieces 30 are arranged between one of the separators 11 and the plate 42, that is, opposite sides of the plate 42 contain one elastic piece 30. Opposite ends of the column 41 are configured to be inserted into the holes 21. The two elastic pieces 30 push the plate 42 to elastically recover the column 41 so as to separate from the hole 21. In at least one embodiment, the elastic piece 30 may be a spring.

Figure 6:
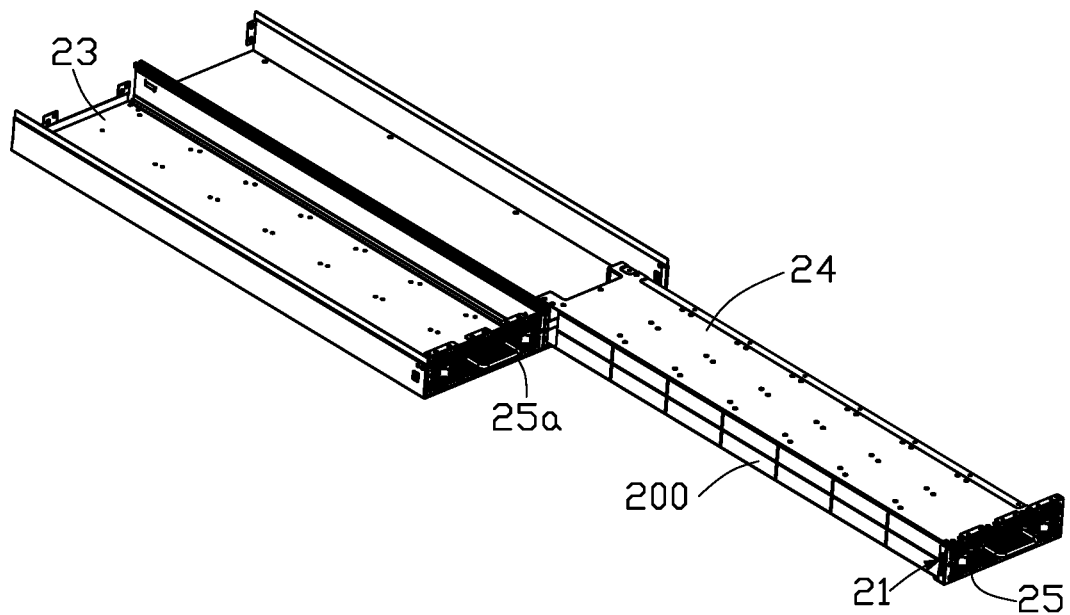
FIG. 6 is a schematic diagram of at least one embodiment of the cabinet of FIG. 1 from another angle.

Referring to FIG. 6, in at least one embodiment, the tray 20 includes a bottom wall 23, a top wall 24, an interior side wall (not shown), and an external side wall 25. The top wall 24 is above the bottom wall 23, the top wall 24 and the bottom wall 23 form a space therebetween for mounting the electronic components 200. The electronic components 200 may be plugged to the trays 20. The interior side wall and the external side wall 25 are connected to edges of the bottom wall 23 and the top wall 24, the external side wall 25 is on an external side of the tray 20, the interior side wall is close to an internal side of the tray 20. The hole 21 is defined on the external side wall 25, the protrusion 22 is arranged on the interior side wall. The external side wall 25 further includes a handle 25a for user operation to control the tray 20.

Figure 7:
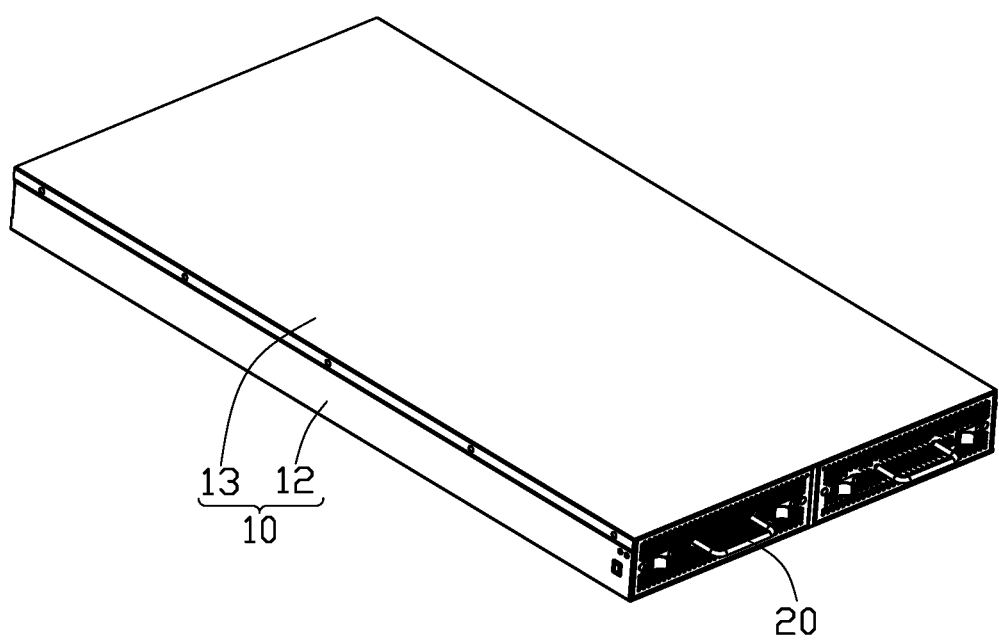
FIG. 7 is a schematic diagram of at least one embodiment of the cabinet in another state according to the present disclosure.

Referring to FIG. 7, the housing 10 further includes a lower housing 12 and an upper housing 13. The lower housing 12 supports the two trays 20. A side of the tray 20 is slidably connected to a folded edge of the lower housing 12 through a slideway, the other side of the tray 20 is slidably connected to the separator 11 through the slideway. The upper housing 13 covers and protects the two trays 20.

The present disclosure is described in relation to a server (not shown) including the cabinet 100.

When the tray 20 of the cabinet 100 slides out of the opening, the protrusion 22 slides to the limiting piece 40 and pushes the limiting piece 40 into the hole 21 of the other tray 20, so as to limit the movement of the other tray 20. When the tray 20 is retracted in the housing 10, the protrusion 22 slides away from the limiting piece 40, the elastic piece 30 elastically recovers the limiting piece 40, so the limiting piece 40 separates from the hole 21. Thereby, the self-locking function of the cabinet 100 is retained but ratio of use to size of the interior space is increased. The server including the cabinet 100 will have same self-locking function and improve an interior space use ratio.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A cabinet configured for a server, the cabinet comprising:

a housing defining an opening;

two trays arranged in parallel and being slidable out of the opening or retractable in the housing, each of the trays being configured to support a plurality of electronic components;

an elastic piece connected to an end of the housing closest to the opening, the elastic piece being arranged between the two trays; and a limiting piece connected to the elastic piece and arranged between the two trays, each of the trays defining a hole corresponding to the limiting piece, each of the trays comprising a protrusion on an interior side;

wherein when one of the trays slides out of the opening, the protrusion slides to the limiting piece and pushes the limiting piece to be inserted into the hole of the other tray to limit a movement of the tray; when the tray retracts into the housing, the protrusion slides away from the limiting piece, the elastic piece is capable of elastically resetting the limiting piece, the limiting piece separates from the hole of the other tray;

the protrusion comprises a bevel and a plane connected to the bevel, the bevel faces to the limiting piece, the plane is parallel to a slide direction of the trays, the bevel slidably contacts the limiting piece to push the limiting piece into the hole, until the limiting piece contacts the plane, the plane is configured to retain the limiting piece in the hole.

2. The cabinet of claim 1, wherein the housing comprises two separators arranged between the two trays, the two separators form a gap therebetween, the gap is configured to receive the elastic piece and the limiting piece, each of the two separators defines a through hole, each of opposite ends of the limiting piece is inserted into the through hole.

3. The cabinet of claim 1, wherein each of opposite ends of the limiting piece comprises a rounded corner or a chamfer configured for decreasing a friction between the limiting piece and the bevel and the plane.

4. The cabinet of claim 1, wherein a distance between one end of the limiting piece and the hole closest to the end of the limiting piece is smaller than a half of a height of the protrusion.

5. The cabinet of claim 1, wherein the cabinet comprises two limiting pieces and two holes.

6. The cabinet of claim 2, wherein the limiting piece comprises a column and a plate, the plate is connected to a middle of the column and arranged between the two separators, the cabinet comprises two elastic pieces, the two elastic pieces are arranged between one of the separators and the plate, respectively; opposite ends of the column are configured to be inserted into the holes, the two elastic pieces push the plate to elastically recover the column to separate from the hole.

7. The cabinet of claim 1, wherein the tray comprises a bottom wall, a top wall, an interior side wall, and an external side wall, the top wall is above the bottom wall, the top wall and the bottom wall form a space therebetween for mounting the electronic components, the interior side wall and the external side wall are connected to edges of each of the bottom wall and the top wall, the external side wall is on an external side of the tray, the interior side wall closes to an internal side of the tray, the hole is defined on the external side wall, the protrusion is arranged on the interior side wall.

8. The cabinet of claim 1, wherein the housing comprises a lower housing and an upper housing, lower housing is configured to support the two trays, a side of the tray is slidably connected to an edgefold of the lower housing through a slideway, the upper housing is configured to cover the two trays.

9. A server comprises a cabinet, the cabinet comprising:
a housing defining an opening;
two trays arranged in parallel and being slidable out of the opening or retractable into the housing, each of the trays being configured to support a plurality of electronic components;
an elastic piece connected to an end of the housing closest to the opening, the elastic piece being arranged between the two trays; and
a limiting piece connected to the elastic piece and arranged between the two trays, each of the trays defining a hole corresponding to the limiting piece, each of the trays comprising a protrusion on an interior side;
wherein when one of the trays slides out of the opening, the protrusion slides into the limiting piece and pushes the limiting piece to be inserted into the hole of the other tray to limit a movement of the tray; when the tray retracts into the housing, the protrusion slides away from the limiting piece, the elastic piece is capable of elastically resetting the limiting piece, the limiting piece separates from the hole,
the protrusion comprises a bevel and a plane connected to the bevel, the bevel faces to the limiting piece, the plane is parallel to a slide direction of the trays, the bevel slidably contacts the limiting piece to push the limiting piece into the hole, until the limiting piece contacts the plane, the plane is configured to retain the limiting piece in the hole.

10. The server of claim 9, wherein the housing comprises two separators arranged between the two trays, the two separators form a gap therebetween, the gap is configured to receive the elastic piece and the limiting piece, each of the two separators defines a through hole, each of opposite ends of the limiting piece is inserted into the through hole.

11. The server of claim 9, wherein each of opposite ends of the limiting piece comprises a rounded corner or a chamfer configured for decreasing a friction between the limiting piece and the bevel and the plane.

12. The server of claim 9, wherein a distance between one end of the limiting piece and the hole closest to the end of the limiting piece is smaller than a half of a height of the protrusion.

13. The server of claim 9, wherein the cabinet comprises two limiting pieces and two holes.

14. The server of claim 10, wherein the limiting piece comprises a column and a plate, the plate is connected to a middle of the column and arranged between the two separators, the cabinet comprises two elastic pieces, the two elastic pieces are arranged between one of the separators and the plate, respectively; opposite ends of the column are configured to be inserted into the holes, the two elastic pieces push the plate to elastically recover the column to separate from the hole.

15. The cabinet of claim 9, wherein the tray comprises a bottom wall, a top wall, an interior side wall, and an external side wall, the top wall is above the bottom wall, the top wall and the bottom wall form a space therebetween for mounting the electronic components, the interior side wall and the external side wall are connected to edges of each of the bottom wall and the top wall, the external side wall is on an external side of the tray, the interior side wall closes to an internal side of the tray, the hole is defined on the external side wall, the protrusion is arranged on the interior side wall.

16. The cabinet of claim 9, wherein the housing comprises a lower housing and an upper housing, lower housing is configured to support the two trays, a side of the tray is slidably connected to an edgefold of the lower housing through a slideway, the upper housing is configured to cover the two trays.

* * * * *